H. MATZNER

April 18, 1933. RADIODIAL Re. 18,796

Original Filed July 30, 1927

WITNESSES

E. A. Wilson

Franklin J. Foster

INVENTOR

HYMAN MATZNER

BY Munn & Co.

ATTORNEY

Reissued Apr. 18, 1933 Re. 18,796

UNITED STATES PATENT OFFICE

HYMAN MATZNER, OF NEW YORK, N. Y., ASSIGNOR TO THOMAS A. EDISON, INCORPORATED, OF WEST ORANGE, NEW JERSEY, A CORPORATION OF NEW JERSEY

INDICATOR FOR RADIORECEIVERS

Original No. 1,674,603, dated June 19, 1928, Serial No. 209,517, filed July 30, 1927. Application for reissue filed January 14, 1930. Serial No. 420,768.

The present invention is concerned with improvements in radio dials, an object of the invention being to provide a dial equipped with a conspicuous indicator which becomes active whenever the dial has been rotated to the proper point to bring in a station on an associated receiving set.

While the indicating means might be an audible one I prefer to use a visible indicator such as the lamp which illuminates a window on the face of the dial at times when the dial has been set to bring in a station. If the lamp lights and the station is inaudible, it is an indication that that particular station is not broadcasting at the moment.

Additional indicating means is preferably provided in the nature of visible station call letters which are exposed at the same time that the lamp is lit, so that the operator of the dial will know just which station he is getting without waiting for any announcement of the station call letters.

Another object of the invention is to provide a radio dial having an improved means for manipulating it; specifically to provide a driving or rotating means for the dial which will permit minute dial adjustments, and at the same time prevent the play and back-lash which is one of the recognized disadvantages of present gear-driven dials.

Other objects of the invention are to provide a dial of simple, practical construction, which will be neat and attractive in appearance, rugged, durable and efficient in use, and well suited to the requirements of economical manufacture and convenient manipulation.

With the above noted and other objects in view, the invention consists in certain novel features of construction and combinations and arrangements of parts, as will be more fully understood from the following description in connection with the accompanying drawing, wherein—

Figure 1:
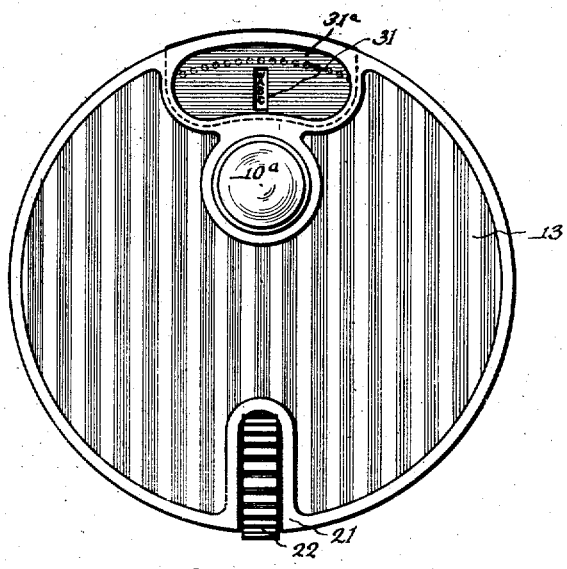
Fig. 1 is a front elevational view of a dial embodying the invention.
Figure 2:
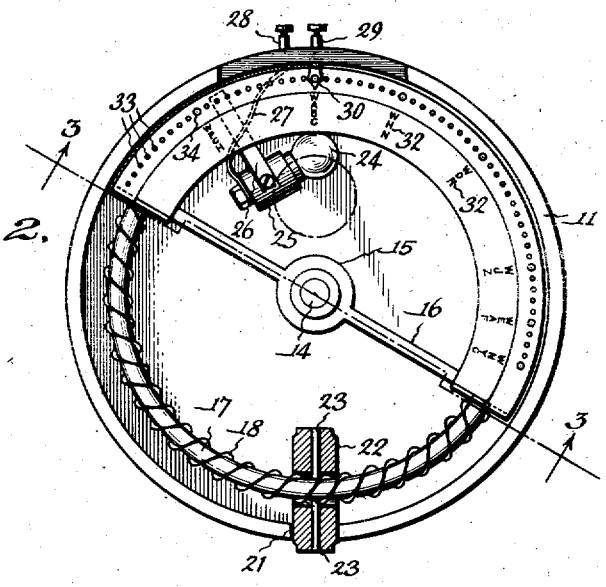
Fig. 2 is a similar view with the cover of the dial removed.
Figure 3:
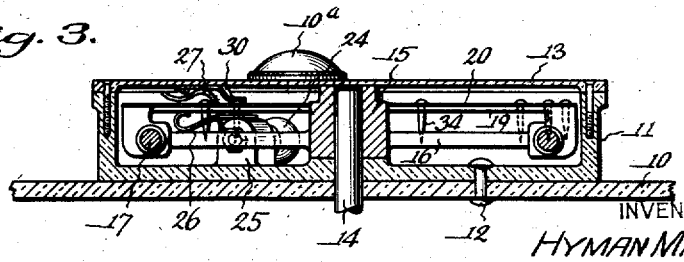
Fig. 3 is a transverse sectional view on the line 3—3 of Fig. 2.

In the drawing I have used the reference numeral 10 to designate the panel board of a radio receiving set, and the reference numeral 11 to indicate a circular dial casing fixed to the panel board as by a screw 12 and provided with a cover 13. A shaft 14 controlling the radio set is journalled in the panel and the bottom of the casing 11, and carries a hub 15 disposed within the dial casing.

Spider arms 16 projecting radially from the hub carry an annular member 17. One section of this member, preferably a semi-circular section thereof is provided with a spiral thread 18, and the other section carries a semi-circular conductive plate 19 upon which is mounted a similarly shaped strip of paper or the like 20.

The dial casing 11 and cover 13 are cut away as at 21 to accommodate a nut 22 having inwardly projecting pins 23 meshing with the spiral thread 18. The nut 22 being limited against lateral movement by the walls of the dial casing and cover acts when rotated to transmit movement to the screw 18 and rotate the ring 17, hub 15 and shaft 14. This screw or worm motion is of course very slow so that extremely fine adjustments of the dial may be had. The screw must also prevent any back-lash such as is present in the ordinary type of gear driven dials.

The cover 13 is provided with a window $10^a$ arranged above a signal lamp 24 mounted in a block 25 integral with the base of the dial housing 11.

One side of this lamp is connected by a spring contact 26 to the brass plate 19, and the other side of the lamp is connected through a wire 27 directly to a source of current (not shown) through a binding post 28. A return lead from the battery or other source of current connects to a second binding post 29 which may be disposed in any desired location, and is in electrical contact with a circuit closing finger 30 secured to the inner face of the casing 11 immediately adjacent an indicating opening 31 arranged in the casing cover.

Preferably, the inner portion of the strip 20 displays station call letters such as 32, and the outer portion of the strip 20 is provided with a plurality of closely arranged apertures 33 into any of which contact pins 34 are adapted to be dropped; these pins making electrical contact with the plate 19.

One of the contact pins is of course arranged adjacent each station call letter, the call letters being written and the pins emplaced by the dial operator after a thorough test of the exact dial positions in which the various stations are received.

As the dial is rotated by turning the nut 22, the heads of the contact pins 34 will come into contact with the finger 30 closing a circuit through the lamp 34 and illuminating the window 10[a]. This illumination will be sufficiently bright to render the call letters which are exposed through the opening 31 in the bottom of the depression 31[a] in the cover 13 readily discernible. The strip 20 upon which the call letters 32 appear may be of celluloid or other transparent material, or the strip may be lighted by indirect lighting.

By virtue of this construction an operator may simply rotate the dial and note that whenever the signal lamp lights the dial is set in proper position for receiving a station. By observing the call letters through the window 31 he can tell just which station he should be receiving, and if no signals are heard he will note that the station is not broadcasting at that particular moment.

Various changes and alterations might be made in the general form and arrangement of the parts described without departing from the invention. Hence I do not wish to limit myself to the details set forth, but shall consider myself at liberty to make such changes and alterations as fairly fall within the spirit and scope of the appended claims.

I claim:

1. A dial for radio receiving sets including an electrical indicator adapted to be rendered active only when the dial is set to tune in a station, a normally open circuit in which said indicator is arranged, and circuit closing means carried by the dial, said circuit closing means including a plurality of contact members carried by the dial and disposed in circuit closing position only when the dial is set to tune in a station.

2. A radio dial including a stationary housing, a dial rotatable in the housing, a signal lamp in the housing arranged under a window therein, a normally open lamp controlling circuit, and circuit closing means carried by the dial comprising contact pins selectively positioned on the dial in accordance with the dial settings necessary to tune in broadcasting stations.

3. The combination with a radio receiver having a signal selector controllable in position by the operator to select desired stations, of a source of light, and means associated therewith and with said selector for providing a light signal whenever said selector is set to receive signals from any one of a plurality of previously chosen stations.

4. The combination with a radio receiver comprising a signal selector controllable in position by the operator to select desired stations, an operating member for controlling the adjustment of said signal selector, a lamp, a circuit for energizing said lamp and comprising contacts for causing illumination thereof, and means movable synchronously with said signal selector for causing closure of said contacts to illuminate said lamp.

5. The combination with a radio receiver comprising a signal selector controllable in position by the operator to select desired stations, of means for controlling the adjustment of said signal selector, a lamp, a circuit for energizing said lamp and comprising a make and break contactor for controlling the illumination of said lamp, said make and break contactor being operatively associated with said signal selector to cause illumination of said lamp at predetermined settings of said selector only.

6. The combination with a radio receiver having a signal selector, of an indicator arranged to carry station identifying indicia in station indicating position, a lamp positioned so as to render said station identifying indicia more easily visible, a circuit for energizing said lamp, said circuit comprising a make and break contactor for controlling the illumination of said lamp, and means movable with said signal selector to effect closure of said circuit when said selector is set to receive signals from a previously chosen transmitting station.

7. The combination with a radio receiver having a signal selector, of a lamp and circuit controlling means for causing said lamp to give a light signal when said selector is set to receive signals from any one of a previously selected group of stations, a portion of said means being selectively positionable to provide said signal at each setting of said selector at which one of said group of stations is received.

8. The combination with a radio receiver having a signal selector, of a housing having a window therein, a movable markable member operatively associated with said signal selector and disposed within said housing behind said window and having different portions thereof visible through said window as said signal selector is adjusted, a signal lamp positioned to illuminate the portion of said member visible through said window, and a circuit for energizing said signal lamp, said circuit comprising a source of energy and a pair of normally open contacts closed by adjustment of said signal selector to the position to select a desired station.

Signed at New York, in the county of New York, and State of New York, this 7th day of January, A. D. 1930.

HYMAN MATZNER.